United States Patent
Nie et al.

(10) Patent No.: US 10,871,525 B2
(45) Date of Patent: Dec. 22, 2020

(54) WIRE DETECTION DEVICE AND METHOD

(71) Applicants: BOE TECHNOLOGY GROUP CO., LTD., Beijing (CN); CHENGDU BOE OPTOELECTRONICS TECHNOLOGY CO., LTD., Sichuan (CN)

(72) Inventors: Jun Nie, Beijing (CN); Jingang Zhang, Beijing (CN); Fucheng Yang, Beijing (CN)

(73) Assignees: BOE TECHNOLOGY GROUP CO., LTD., Beijing (CN); CHENGDU BOE OPTOELECTRONICS TECHNOLOGY CO., LTD., Sichuan (CN)

( * ) Notice: Subject to any disclaimer, the term of this patent is extended or adjusted under 35 U.S.C. 154(b) by 192 days.

(21) Appl. No.: 16/106,594

(22) Filed: Aug. 21, 2018

(65) Prior Publication Data
US 2019/0285684 A1    Sep. 19, 2019

(30) Foreign Application Priority Data
Mar. 15, 2018   (CN) .......................... 2018 1 0213777

(51) Int. Cl.
*G01R 31/50*  (2020.01)
*G01N 27/447*  (2006.01)
*G02F 1/13*  (2006.01)
*G02F 1/1343*  (2006.01)
*G02F 1/1362*  (2006.01)

(52) U.S. Cl.
CPC ....... *G01R 31/50* (2020.01); *G01N 27/44704* (2013.01); *G02F 1/1309* (2013.01); *G02F 1/1343* (2013.01); *G02F 2001/136263* (2013.01)

(58) Field of Classification Search
None
See application file for complete search history.

(56) References Cited

U.S. PATENT DOCUMENTS

| | | | |
|---|---|---|---|
| 2007/0187613 A1* | 8/2007 | Kahilainen | H01J 47/026 250/389 |
| 2010/0194414 A1* | 8/2010 | Jun | G01R 31/308 324/754.23 |
| 2018/0180750 A1* | 6/2018 | McGregor | G01T 3/008 |

* cited by examiner

*Primary Examiner* — Nasima Monsur
(74) *Attorney, Agent, or Firm* — Brooks Kushman P.C.

(57) ABSTRACT

A wire detection device and a wire detection method are provided. The wire detection device includes: a chamber body including a first side and a second side arranged opposite to each other; an electrode arranged at the second side of the chamber body; particles arranged within the chamber body; and a signal applying circuit configured to apply an electric signal to at least one wire to be tested arranged at the first side.

16 Claims, 3 Drawing Sheets

WIRE DETECTION DEVICE AND METHOD

CROSS-REFERENCE TO RELATED APPLICATION

This application claims priority to Chinese Patent Application No. 201810213777.4 filed on Mar. 15, 2018, which is incorporated herein by reference in its entirety.

TECHNICAL FIELD

The present disclosure relates to the field of electronic products, for example to a wire detection device and a wire detection method.

BACKGROUND

With the development of the display industry, a display product having a high resolution and a narrow bezel has become more and more popular, so width of each wire in a display panel becomes smaller and smaller, and a pitch (a distance between two adjacent wires) becomes smaller and smaller. As a direct consequence, utilizing technology in the related art, it is impossible to detect defects for each wire, e.g., detect wire break or whether the wire is scratched.

SUMMARY

A wire detection device, including: a chamber body including a first side and a second side arranged opposite to each other; an electrode arranged at the second side of the chamber body; particles arranged within the chamber body; and a signal applying circuit configured to apply an electric signal to at least one wire to be tested arranged at the first side.

In some embodiments, at least a portion of the second side of the chamber body is transparent, the electrode is a transparent electrode, the chamber body is filled with an electrophoresis solution, and the particles are electrophoresis particles.

In some embodiments, the electrophoresis solution is colored, and a color of the particles is different from a color of the electrophoresis solution.

In some embodiments, the chamber body includes a plurality of microcapsules arranged in an array form, and the electrophoresis solution and the electrophoresis particles are arranged in each microcapsule of the plurality of microcapsules.

In some embodiments, the electrophoresis solution is colorless, and the particles are colored electrophoresis particles.

In some embodiments, the chamber body includes a plurality of microcapsules arranged in an array form, and the electrophoresis solution and the electrophoresis particles are arranged in each microcapsule of the plurality of microcapsules.

In some embodiments, each of the electrophoresis particles is positively charged, and the electrode is grounded or a negative voltage is applied to the electrode.

In some embodiments, each of the electrophoresis particles is negatively charged, and the electrode is grounded or a positive voltage is applied to the electrode.

In some embodiments, the chamber body is made of an electric insulation material.

A wire detection method, including:

applying, by a signal applying circuit, an electric signal different from an electrode signal applied to an electrode to at least one wire to be tested, to generate an electric field within a chamber body between the at least one wire to be tested and the electrode, and drive particles within the chamber body by the electric field to move toward a first side of the chamber body; and detecting whether the at least one wire to be tested is defective based on an aggregation state of the particles at a first side of the chamber body, where the chamber body includes the first side and a second side arranged opposite to the first side, the at least one wire to be tested are arranged at the second side, and the electrode is arranged at the first side.

In some embodiments, the applying the electric signal different from the electrode signal applied to the electrode to the at least one wire to be tested includes:

enabling ends of a plurality of lines to be short-circuited, where the at least one wire to be tested includes the plurality of lines; and applying the electric signal different from the electrode signal applied to the electrode to the plurality of lines.

In some embodiments, at least a portion of the first side of the chamber body is transparent, the electrode is a transparent electrode, the chamber body is filled with an electrophoresis solution, and the particles are electrophoresis particles;

the detecting whether the at least one wire to be tested is defective based on the aggregation state of the particles at a first side of the chamber body includes: detecting whether the at least one wire to be tested is defective based on a pattern formed by the electrophoresis particles at the first side and matching the at least one wire to be tested.

In some embodiments, the detecting whether the at least one wire to be tested is defective based on a pattern formed by the electrophoresis particles at the first side and matching the at least one wire to be tested includes:

providing a predetermined pattern formed by the particles between the at least one wire to be tested in an intact state and the electrode;

comparing the pattern formed by the electrophoresis particles with the predetermined pattern; and determining that at least one wire of the at least one wire to be tested is defective when the pattern is different from the predetermined pattern.

In some embodiments, the wire detection method further includes, after determining that the at least one wire is defective, changing at least one of the electric signal applied to the at least one wire to be tested or the electrode signal applied to the electrode, to form a changed electric field, thereby to drive the electrophoresis particles by the changed electric field to move toward the first side of the chamber body.

In some embodiments, the applying, by the signal applying circuit, the electric signal different from the electrode signal applied to the electrode to the at least one wire to be tested includes enabling the electrode to be grounded and applying a negative voltage to the at least one wire to be tested.

In some embodiments, the applying, by the signal applying circuit, the electric signal different from the electrode signal applied to the electrode to the at least one wire to be tested includes enabling the electrode to be grounded and applying a positive voltage to the at least one wire to be tested.

DETAILED DESCRIPTION

In the related art, it is impossible to detect each of wires with small pitches. Wire detection devices and wire detection methods provided in the following embodiments detect defects of the one or more wires of wires with small pitches in a cost-effective and low-energy-consuming manner, and a structure of the wire detection devices is simple.

Figure 1:
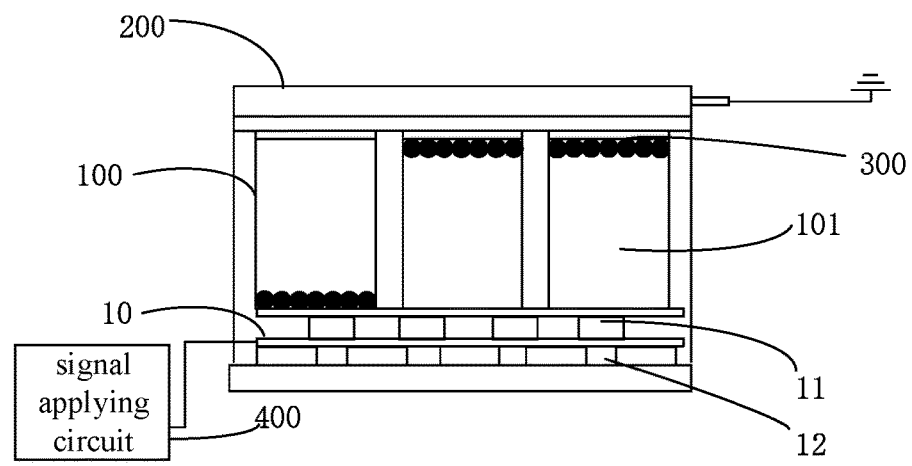
FIG. 1 is a schematic view showing a wire detection device according to some embodiments.

Some embodiments provide a wire detection device which, as shown in FIG. 1, includes a chamber body 100, an electrode 200, particles 300 arranged within the chamber body 100, and a signal applying circuit 400.

The chamber body 100 includes a first side and a second side arranged opposite to each other, and at least one wire 10 to be tested is arranged at the first side.

The electrode 200 is arranged at the second side of the chamber body 100 and configured to generate an electric field within the chamber body 100.

The particles 300 are capable of moving when the electric field is generated, to detect whether the at least one wire 10 to be tested is defective according to an aggregation state of the particles 300 moving to the second side of the chamber body 100.

The signal applying circuit 400 is configured to apply an electric signal which is different from an electrode signal to the at least one wire 10 to be tested, and the electrode signal is an electric signal applied to the electrode 200.

The wire detection device provided in the above embodiments includes the chamber body 100 and the electrode 200, and the particles 300 are arranged within the chamber body 100. During the detection, at least one wire 10 to be tested are short-circuited, and then the signal applying circuit 400 output the electric signal different from the electrode signal to at least one wire 10 to be tested. At this time, the at least one wire to be tested serves as an electrode, the electric field is generated by the at least one wire 10 to be tested and the electrode 200, the electric field is generated within the chamber body 100, and the particles 300 within the chamber body 100 is driven by the electric field to move to the second side of the chamber body 100. The aggregation state of the particles 300 at a position where defective position of at least one wire 10 to be tested is projected to the second side, is different from the aggregation state of the particles 300 at a position where intact position of the at least one wire 10 to be tested is projected to the second side.

For example, when the at least one wire to be tested is broken or scratched, the movement of particles 300 between the defective position where the at least one wire to be tested is broken or scratched and the electrode is different from that of particles 300 between the intact position where the at least one wire to be tested is intact and the electrode. As a result, it is able to detect whether the at least one wire is defective (e.g., whether at least one wire is broken or scratched) based on the aggregation state of the particles 300 at the second side of the chamber body 100.

According to the wire detection device in the above embodiments, the electric signal is applied to the all of wires to be tested at the same time without applying electric signal to wires one by one, so it is unnecessary to detect the wires to be tested through a precise alignment device, thereby to perform the detection in a simple, low-power-consuming and cost-effective manner.

In some embodiments, the wire detection device is used to detect each one of wires with small pitches, e.g. smaller than 200 um, to determine whether one or more wires are broken or scratched.

In some embodiments, the wire detection device is configured to detect at least one wire of wires with pitches, e.g., to detect whether one or more wires of a Sensor On Glass (SOG) sensor or a Touch Panel (TP) sensor are broken and/or damaged.

In some embodiments, the wire detection device is configured to detect wires in a Liquid Crystal Display (LCD).

Utilizing the wire detection device provided in some embodiments, whether at least one wire is defective is determined based on the aggregation state of the particles 300 at the second side of the chamber body 100. In some embodiments, the particles 300 are charged particles, and driven by the electric field to move toward the second side of the chamber body 100. Whether the at least one wire to be tested is defective is determined based on an aggregation state of the charged particles at the second side of the chamber body 100.

In some embodiments, the charged particles are colored. Whether the at least one wire to be tested is defective is determined based on a colored pattern formed by the aggregation of charged particles at the second side of the chamber body 100 (which may refer to a structure of an electronic paper).

In some embodiments, the particles 300 are liquid crystal molecules which are capable of deflecting driven by the electric field in the chamber body 100. For example, when one wire of the at least one wire to be tested is defective, there is no electric field between the defective position of the wire and the electrode 200, and at this time the liquid crystal molecules between the defective position of the wire and the electrode 200 do not deflect. When one wire of the at least one wire to be tested is intact, there is an electric field generated between the intact wire and the electrode 200, and at this time the liquid crystal molecules between the intact wire and the electrode deflect due to the generated electric field. Hence, whether the wire of the at least one wire to be tested is defective is determined based on a deflection state of the liquid crystal molecules.

Some embodiments provides a wire detection device, as shown in FIG. 1, includes a chamber body 100 including a first side and a second side arranged opposite to each other, an electrode 200 arranged at the second side, particles 300 arranged within the chamber body 100, and a signal applying unit 400. At least a portion of the second side of the chamber body 100 is transparent, the electrode 200 is a transparent electrode, the chamber body 100 is filled with an electrophoresis solution, and the particles 300 are electrophoresis particles.

The signal applying circuit 400 is configured to apply an electric signal which is different from an electrode signal applied to the electrode 200 to a plurality of wires 10 to be tested.

When the electric signal is applied by the signal applying circuit 400 to the plurality of wires 10 to be tested at the first side of the chamber body 100, an electric field is generated within the chamber body 100 by the electrode 200 and the plurality of wires 10 to be tested. At this time, the particles 300 are driven to move toward the second side of the chamber body 100 and aggregating at the second side, to form a pattern matching the plurality of wires 10 to be tested.

According to the above embodiments, the wire detection device utilizes a display principle of the electronic paper, after the plurality of wires to be tested are short-circuited, the electric signal different from the electrode signal applied to the electrode 200 is applied to the plurality of wires to be tested, to generate the electric field within the chamber body 100, thereby to drive the electrophoresis particles to move to the second side of the chamber body 100, and enable the electrophoresis particles to aggregate at the second side of the chamber body 100. Because at least a portion of the second side of the chamber body 100 and the electrode 200 are transparent, the pattern matching the plurality of wires to be tested is formed by the electrophoresis particles aggregating at the second side of the chamber body 100. As a result, it is able to determine whether the plurality of wires to be tested are broken and/or damaged according to the pattern.

In some embodiments, the electrophoresis solution is colored, and the particles 300 are colored or colorless, i.e., a color of electrophoresis particles 300 is different from a color of the electrophoresis solution. In some embodiments, the electrophoresis solution is colorless and the particles 300 are colored. In this way, it is able to form a colored pattern at the second side of the chamber body 100.

In some embodiments, as shown in FIG. 1, the chamber body 100 includes a plurality of microcapsules 101 arranged in an array form, and the electrophoresis solution and the electrophoresis particles are arranged in each microcapsule 101.

As mentioned above, the chamber body 100 includes the plurality of microcapsules 101, and the electrophoresis solution and the electrophoresis particles are arranged in each microcapsule 101. As a result, it is able for the pattern formed by the electrophoresis particles to be viewed easily, thereby to accurately form the pattern of the at least one wire to be tested and improve the reliability of a detection result.

According to the above embodiments, the display principle of the electronic paper is utilized; the wire detection device has such advantages as high recognition, lower power consumption, being light and thin, and being easily operated. As a result, it is able to detect the defect of the at least one wire to be tested, improve the yield, and reduce the manufacture cost.

In some embodiments, the electrode 200 is grounded, and a polarity of each electrophoresis particle 300 is the same as a polarity of the electric signal applied to the at least one wire 10 to be tested.

In some embodiments, the electrophoresis particles are positively charged, the electrode 200 is grounded, and a positive voltage is applied to the at least one wire 10 to be tested.

In some embodiments, the electrophoresis particles are negatively charged, the electrode 200 is grounded, and a negative voltage is applied to the at least one wire 10 to be tested.

In some embodiments, a positive voltage is applied to the electrode 200, and the at least one wire 10 to be tested are grounded. In some embodiments, a positive voltage is applied to the electrode 200, and a negative voltage is applied to the at least one wire 10 to be tested, to drive the electrophoresis particles 300 by the electric field to move to a side of the chamber body where the electrode 200 is located. The electric field is generated in the chamber body between the at least one wire 10 to be tested and the electrode 200.

In some embodiments, the chamber body 100 is made of an electric insulation material, to prevent the chamber body 100 from interfering with the electric field between the electrode 200 and the at least one wire 10 to be tested.

In some embodiments, at least one wire of an SOG sensor is detected using the above-mentioned wire detection device, and a detection procedure and a detection principle are described as follows.

Figure 2:
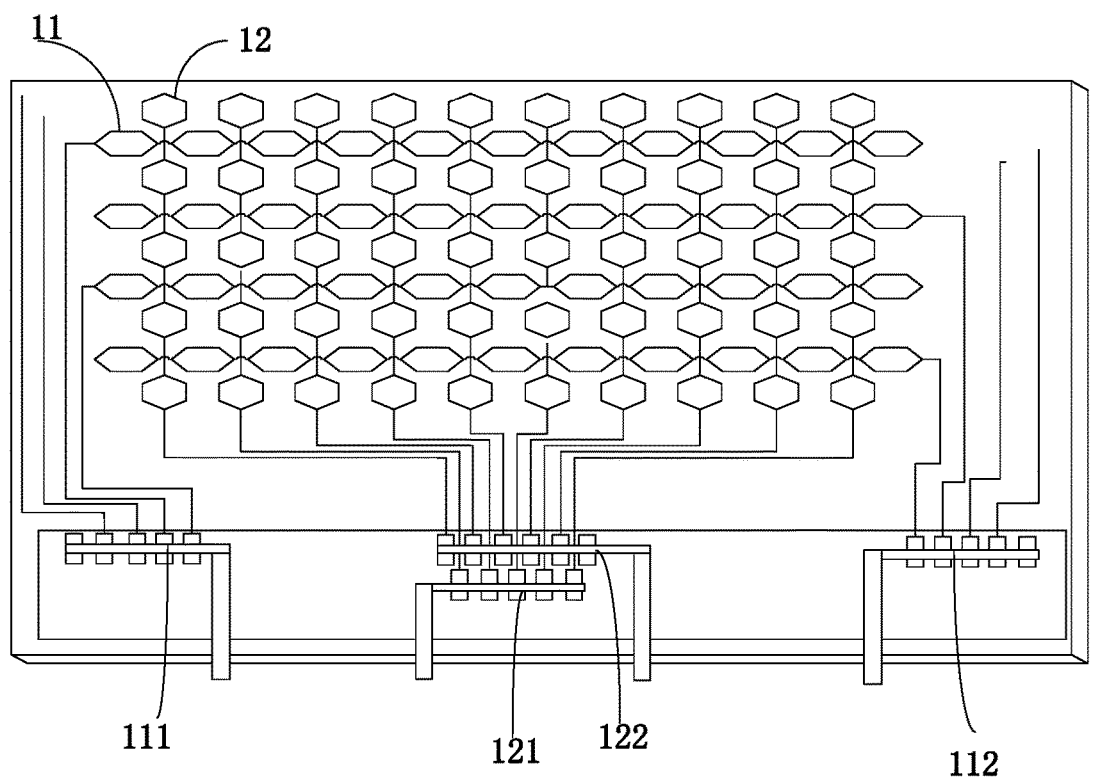
FIG. 2 is a schematic view showing at least one wire to be detected by the wire detection device according to some embodiments.

As shown in FIG. 2, the at least one wire of the SOG sensor include a plurality of lines (wires) including transmission (TX) lines 11 and reception (RX) lines 12, and projections of TX lines on circuit board and projections of RX lines on the circuit board cross. During the detection for the plurality of lines, output ends of the TX lines 11 are short-circuited and connected to a lead.

In some embodiments, a first connection member including the lead is formed on a circuit board, and the plurality of TX lines 11 are connected to the lead, to enable the output ends of the TX lines 11 to be short-circuited.

In some embodiments, due to the TX lines being densely arranged, as shown in FIG. 2, the first connection member includes a first even-numbered connection member 111 and a first odd-numbered connection member 112. The even-numbered TX lines are connected to the first even-numbered connection member 111, so that the output ends of the even-numbered TX lines 11 are short-circuited. The odd-numbered TX lines are connected to the first odd-numbered connection member 112, so that the output ends of the odd-numbered TX lines 11 are short-circuited.

In some embodiments, the first connection member is formed as one piece and includes at least one first terminal and one lead. Each first terminal is connected to one TX line, and all the TX lines are connected to the lead, i.e., the first connection member.

In some embodiments, input ends of the TX lines are short-circuited.

In some embodiments, the output ends of the RX lines 12 are short-circuited and connected to a lead. In some embodiments, a second connection member is formed on the circuit board, and the RX lines 12 are connected to the second connection member so that the output ends of the RX lines 12 are short-circuited In some embodiments, due to the RX lines being densely arranged, as shown in FIG. 2, the second connection member includes a second even-numbered connection member 121 and a second odd-numbered connection member 122. The even-numbered RX lines are connected to the second even-numbered connection member 121, and the odd-numbered RX lines are connected to the second odd-numbered connection member 122.

In some embodiments, input ends of the RX lines are short-circuited.

For example, when the TX lines 11 are to be detected, the wire detection device is put on the TX lines 11. The signal applying circuit is electrically connected to the first connection member and configured to apply the electric signal to the TX lines 11. At this time, all the TX lines serve as an electrode, and an electric field is generated within the chamber body 100 between this electrode and the electrode 200, to drive the electrophoresis particles by the electric field force to move to the second side of the chamber body 100, thereby to form a colored pattern.

Figure 3:
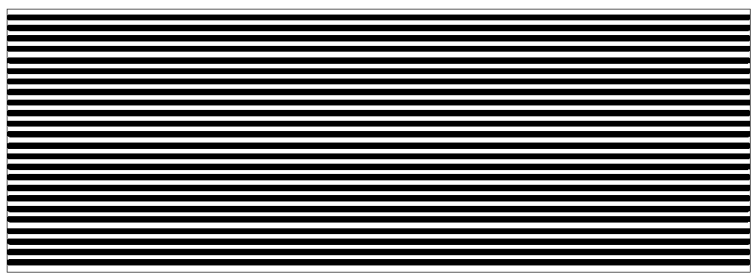
FIG. 3 is a schematic view showing a pattern displaying on the wire detection device when RX lines are intact according to some embodiments.
Figure 4:
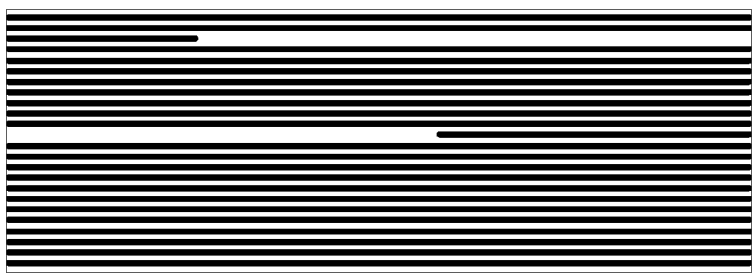
FIG. 4 is a schematic view showing a pattern displaying on the wire detection device when some RX lines are broken according to some embodiments.
Figure 5:
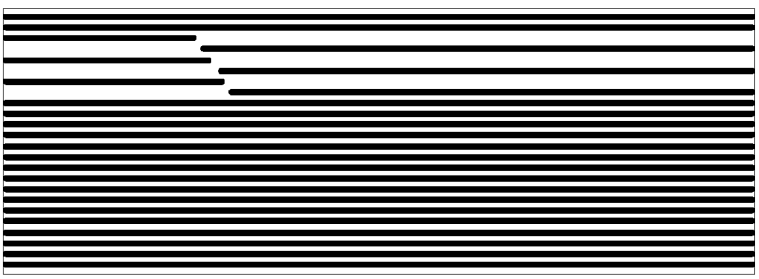
FIG. 5 is a schematic view showing a pattern displaying on the wire detection device when some RX lines are scratched according to some embodiments.

There is a plurality of TX lines 11, and when the TX lines are intact, the pattern includes a plurality of continuous lines (as shown in FIG. 3). When one or more TX lines 11 are broken at one or more positions, the pattern in FIG. 4 may be formed, i.e., the pattern may include one or more broken lines. When the TX lines 11 are scratched, the pattern in FIG. 5 may be formed.

According to the wire detection device in the above embodiments, on the basis of the display principle of the electronic paper, it is able to determine whether the TX line 11 is broken or scratched based on the pattern.

The detection procedure and the detection principle of the RX lines 12 are the same as those of the TX lines 11 mentioned above, a pattern formed by the RX lines includes lines perpendicular to lines in the pattern formed by the TX lines 11.

In some embodiments, after the detection for at least one wire to be tested, if other wires are to be tested, initializing operation is conducted to the pattern, i.e., eliminating the pattern.

Figure 6:
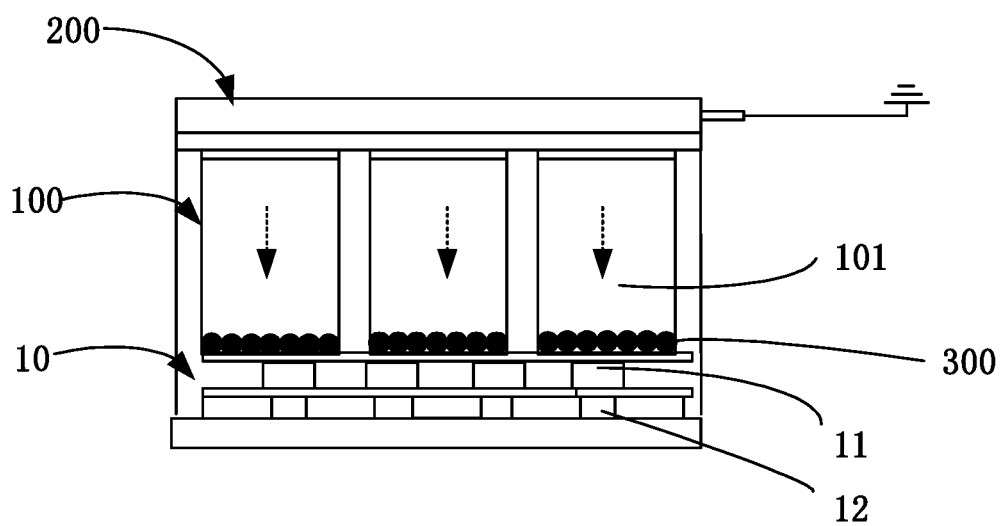
FIG. 6 is a schematic view showing the wire detection device after a pattern at a second side of a chamber body is eliminated according to some embodiments.

In some embodiments, at least one of the electric signal applied to the at least one wire to be tested or the electrode signal applied to the electrode 200 is changed, to change a direction of an electric field force within the entire chamber body 100. In this way, as shown in FIG. 6, a changed electric field drives the electrophoresis particles to move to the first side of the chamber body 100 (i.e., the side where the at least one wire to be tested is located), thereby to eliminate the pattern displaying at the second side of the chamber body 100.

In some embodiments, when the electrode 200 is grounded, a polarity of the electric signal applied to the at least one wire to be tested is changed (e.g., a positive electric signal is applied to the at least one wire to be tested, or the at least one wire to be tested may be grounded), to drive the electrophoresis particles by the changed electric field to move toward the first side of the chamber body 100, thereby to initialize the pattern.

Figure 7:
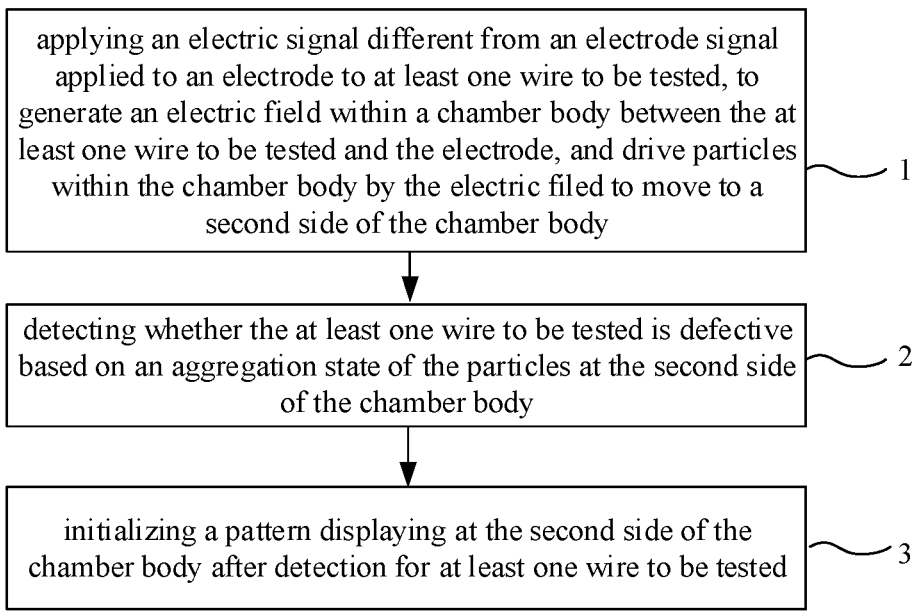
FIG. 7 is a flow chart of a wire detection method according to some embodiments.

In some embodiments, a wire detection method for detecting at least one wire to be tested through the above-mentioned wire detection device is provided. As shown in FIG. 7, the wire detection method includes Step 1 and Step 2.

In Step 1, an electric signal different from an electrode signal applied to the electrode 200 is applied to the at least one wire 10 to be tested, to generate an electric field within the chamber body between the at least one wire 10 to be tested and the electrode 200, and drive the particles within the chamber body by the electric field to move toward the second side of the chamber body.

In Step 2, whether the at least one wire 10 to be tested is defective is detected based on an aggregation state of the particles 300 at the second side.

According to the wire detection method in the above embodiments, during the detection for at least one wire, the electric signal different from the electrode signal applied to the electrode 200 is applied by the signal applying circuit to the at least one wire to be tested. At this time, the at least one wire to be tested serves as an electrode, and the electric field is generated in the chamber body 100 by this electrode and the electrode 200, to drive the particles 300 within the chamber body 100 to move. The aggregation state of the particles 300 at a position where defective position of a wire of the at least one wire 10 to be tested is projected to the second side, is different from the aggregation state of the particles 300 at a position where intact position of the wire is projected to the second side. For example, when a wire is broken or scratched, there is no electric field between the defective position of the wire and the electrode 200, and the particles 300 between the defective position and electrode 200 are incapable of moving toward the second side of the chamber body 100. An electric field is generated by the intact wire and the electrode 200, to drive the particles 300 between the intact wire and electrode 200 to move toward the second side of the chamber body 100. As a result, it is able to detect whether the at least one wire to be tested is defective (e.g., whether at least one wire is broken or scratched) according to the aggregation state of the particles 300 within the chamber body 100.

In the embodiments of the wire detection method, the electric signal is applied to the wires to be tested, without applying electric signal to wires one by one, so it is unnecessary to detect at least one wire to be tested through a precise alignment device, thereby to perform the detection in a simple, low-power-consuming and cost-effective manner.

In some embodiments, the above wire detection method may be used to detect each one of wires to be tested with small pitches, to detect whether at least one wire is broken or damaged.

In some embodiments, the wire detection device is used to detect whether the at least one wire of an SOG sensor, a TP sensor or an LCD is broken and/or damaged.

In some embodiments, in Step 2 of the wire detection method, whether the at least one wire 10 to be tested is defective is determined according to the aggregation state of the particles 300 at the second side of the chamber body 100. The particles 300 are of various types capable of moving driven by the electric field.

In some embodiments, the particles 300 are charged particles and capable of moving driven by the electric field toward the second side of the chamber body 100. Whether the at least one wire to be tested is defective is determined based on an aggregation state of the charged particles at the second side of the chamber body 100.

In some embodiments, the charged particles are colored, and whether the at least one wire to be tested is defective is determined according to a colored pattern formed by the charged particles at the second side of the chamber body 100 (which may refer to a structure of an electronic paper).

In some embodiments, the particles 300 are liquid crystal molecules which are capable of deflecting driven by the electric field within the chamber body 100. For example, when one wire of the at least one wire to be tested is defective, there is no electric field between a defective position of the wire and the electrode 200, and at this time the liquid crystal molecules between the defective position and the electrode 200 do not deflect. When one wire of the at least one wire to be tested is intact, there is the electric field between the wire and the electrode 200, and at this time the liquid crystal molecules between the wire and the electrode 200 deflect due to the electric field. Hence, whether the at least one wire to be tested is defective is determined according to a deflection state of the liquid crystal molecules.

Figure 8:
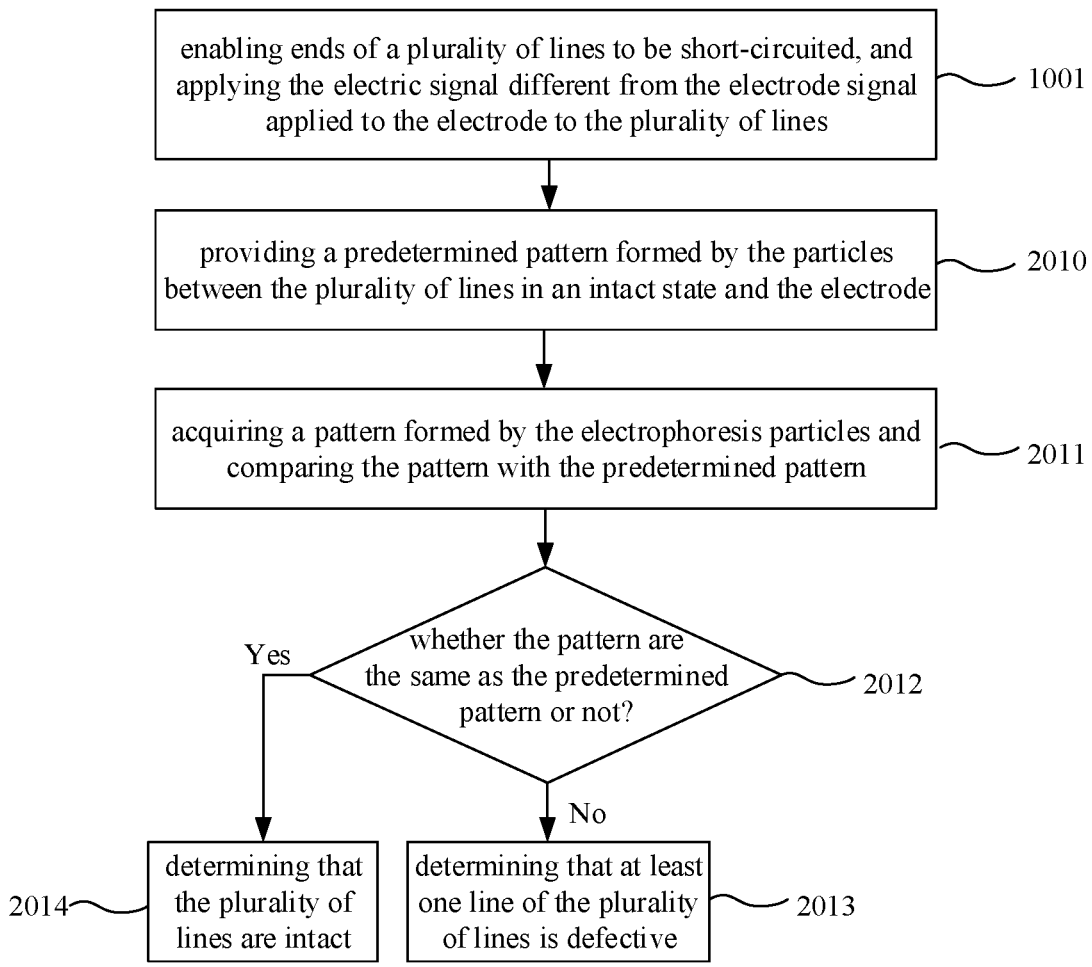
FIG. 8 is another flow chart of the wire detection method according to some embodiments.

In some embodiments, as shown in FIG. 8, Step 1 includes Step 1001.

In Step 1001, the at least one wire 10 to be tested includes a plurality of lines, ends of the plurality of lines to be short-circuited, and the electric signal different from the electrode signal applied to the electrode 200 is applied to the plurality of lines.

In this way, it is unnecessary to apply the electric signal to lines one by one when electric signal is applied to the plurality of lines. In some embodiments, the wire detection method is used to detect the plurality of lines with small pitches. At this time, it is unnecessary to detect the plurality of lines to be tested through a precise alignment device, thereby to perform the detection in a simple and cost-effective manner.

In some embodiments, the particles 300 are electrophoresis particles, and Step 2 includes Step 2001.

In Step 2001, whether the at least one wire 10 to be tested is defective is determined according to a pattern formed by the electrophoresis particles at the second side and matching the at least one wire 10 to be tested.

In some embodiments, as shown in FIG. 8, Step 2001 includes Steps 2010 to 2014.

In Step 2010, a predetermined pattern formed by particles between the plurality of lines in an intact state and electrode is provided.

In Step 2011, a displaying pattern formed by the electrophoresis particles is acquired, and the displaying pattern is compared with the predetermined pattern.

In Step 2012, whether the displaying pattern is the same as the predetermined pattern is determined.

In Step 2013, it is determined that at least one line of the plurality of lines is defective when the displaying pattern is different from the predetermined pattern.

In Step 2014, it is determined that the plurality of lines are intact when the displaying pattern is the same as the predetermined pattern.

In above embodiments, on the basis of the display principle of the electronic paper, the at least one wire to be tested serves as an electrode, and the electric field is generated between this electrode and the electrode 200, to drive the electrophoresis particles to move, thereby to form the pattern matching the at least one wire to be tested. In this way, it is able to determine whether the at least one wire to be tested is defective based on the pattern.

In some embodiments, as shown in FIG. 7, the wire detection method further includes Step 3.

In Step 3, after the detection for at least one wire to be tested, the pattern displaying at the second side of the chamber body is initialized (i.e. the pattern is eliminated).

In some embodiments, Step 3 includes, after the detection for at least one wire to be tested, changing at least one of the electric signal applied to the at least one wire to be tested or the electrode signal applied to the electrode 200, to change a direction of an electric field force within the chamber body 100, thereby to drive the electrophoresis particles by the changed electric field to move toward the first side of the chamber body 100.

After the detection for at least one wire to be tested, the pattern may be initialized for the detection of other wires, i.e., the pattern formed in the detection for at least one wire to be tested may be eliminated completely. At least one of the electric signal applied to the at least one wire to be tested or the electrode signal output to the electrode 200 may be changed, to change a direction of the electric field force within the entire chamber body 100. In this way, it is able to drive the electrophoresis particles by the changed electric field to move to the first side of the chamber body 100 (i.e., the side where the at least one wire to be tested is located), thereby to eliminate the pattern displaying at the second side of the chamber body 100.

In some embodiments, when the electrode 200 is grounded, a polarity of the electric signal applied to the at least one wire to be tested may be changed (e.g., a positive electric signal may be applied to the at least one wire to be tested, or the at least one wire to be tested may be grounded), to drive the electrophoresis particles by the changed electric field to move to the first side of the chamber body 100, thereby to initialize the pattern.

What is claimed is:

1. A wire detection device, comprising:
   a chamber body comprising a first side and a second side arranged opposite to each other, wherein at least one wire to be tested are arranged at the first side;
   an electrode arranged at the second side of the chamber body;
   particles arranged within the chamber body; and
   a signal applying circuit configured to apply an electric signal to the at least one wire to be tested,
   wherein at least a portion of the second side of the chamber body is transparent, the electrode is a transparent electrode, the chamber body is filled with an electrophoresis solution, and the particles are electrophoresis particles, and
   wherein the electrophoresis solution is colored, and a color of the particles is different from a color of the electrophoresis solution; or, the electrophoresis solution is colorless, and the particles are colored electrophoresis particles.

2. The wire detection device according to claim 1, wherein the chamber body comprises a plurality of microcapsules arranged in an array form, and the electrophoresis solution and the electrophoresis particles are arranged in each microcapsule of the plurality of microcapsules.

3. The wire detection device according to claim 1, wherein each of the electrophoresis particles is positively charged, and the electrode is grounded or a negative voltage is applied to the electrode.

4. The wire detection device according to claim 1, wherein each of the electrophoresis particles is negatively charged, and the electrode is grounded or a positive voltage is applied to the electrode.

5. The wire detection device according to claim 1, wherein the chamber body is made of an electric insulation material.

6. A wire detection method, comprising:
   applying, by a signal applying circuit, an electric signal different from an electrode signal applied to an electrode to at least one wire to be tested, to generate an electric field within a chamber body between the at least one wire to be tested and the electrode, and drive particles within the chamber body by the electric field to move toward a first side of the chamber body; and
   detecting whether the at least one wire to be tested is defective based on an aggregation state of the particles at a first side of the chamber body,
   wherein the chamber body comprises the first side and a second side arranged opposite to the first side, the at least one wire to be tested are arranged at the second side, and the electrode is arranged at the first side,
   wherein at least a portion of the second side of the chamber body is transparent, the electrode is a transparent electrode, the chamber body is filled with an electrophoresis solution, and the particles are electrophoresis particles, and
   wherein the detecting whether the at least one wire to be tested is defective based on the aggregation state of the particles at a first side of the chamber body comprises:

providing a predetermined pattern formed by the particles between the at least one wire to be tested in an intact state and the electrode; comparing a pattern formed by the electrophoresis particles with the predetermined pattern; and determining that at least one wire of the at least one wire to be tested is defective when the pattern is different from the predetermined pattern.

7. The wire detection method according to claim 6, wherein the applying the electric signal different from the electrode signal applied to the electrode to the at least one wire to be tested comprises:

enabling ends of a plurality of lines to be short-circuited, and applying the electric signal different from the electrode signal applied to the electrode to the plurality of lines, wherein the at least one wire to be tested comprises the plurality of lines.

8. The wire detection method according to claim 6, further comprising, after determining that the at least one wire is defective, changing at least one of the electric signal applied to the at least one wire to be tested or the electrode signal applied to the electrode, to form a changed electric field, thereby to drive the electrophoresis particles by the changed electric field to move toward the first side of the chamber body.

9. The wire detection method according to claim 6, wherein the applying, by the signal applying circuit, the electric signal different from the electrode signal applied to the electrode to the at least one wire to be tested comprises enabling the electrode to be grounded and applying a negative voltage to the at least one wire to be tested, wherein the electrophoresis particles are negatively charged.

10. The wire detection method according to claim 6, wherein the applying, by the signal applying circuit, the electric signal different from the electrode signal applied to the electrode to the at least one wire to be tested comprises enabling the electrode to be grounded and applying a positive voltage to the at least one wire to be tested, the electrophoresis particles are positively charged.

11. A wire detection device, comprising:
a chamber body comprising a first side and a second side arranged opposite to each other, wherein at least one wire to be tested are arranged at the first side;
an electrode arranged at the second side of the chamber body;
particles arranged within the chamber body; and
a signal applying circuit configured to apply an electric signal to the at least one wire to be tested,
wherein at least a portion of the second side of the chamber body is transparent, the electrode is a transparent electrode, the chamber body is filled with an electrophoresis solution, and the particles are electrophoresis particles, and
wherein each of the electrophoresis particles is positively charged, and the electrode is grounded or a negative voltage is applied to the electrode; or each of the electrophoresis particles is negatively charged, and the electrode is grounded or a positive voltage is applied to the electrode.

12. The wire detection device according to claim 11, wherein the electrophoresis solution is colored, and a color of the particles is different from a color of the electrophoresis solution.

13. The wire detection device according to claim 12, wherein the chamber body comprises a plurality of microcapsules arranged in an array form, and the electrophoresis solution and the electrophoresis particles are arranged in each microcapsule of the plurality of microcapsules.

14. The wire detection device according to claim 11, wherein the electrophoresis solution is colorless, and the particles are colored electrophoresis particles.

15. The wire detection device according to claim 14, wherein the chamber body comprises a plurality of microcapsules arranged in an array form, and the electrophoresis solution and the electrophoresis particles are arranged in each microcapsule of the plurality of microcapsules.

16. The wire detection device according to claim 11, wherein the chamber body is made of an electric insulation material.

\* \* \* \* \*